(12) United States Patent
Naderyan et al.

(10) Patent No.: US 11,649,161 B2
(45) Date of Patent: May 16, 2023

(54) DIAPHRAGM ASSEMBLY WITH NON-UNIFORM PILLAR DISTRIBUTION

(71) Applicant: Knowles Electronics, LLC, Itasca, IL (US)

(72) Inventors: Vahid Naderyan, Chicago, IL (US); Mohammad Mohammadi, Arlington Heighls, IL (US); Xin Song, Carol Stream, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 28 days.

(21) Appl. No.: 17/385,084

(22) Filed: Jul. 26, 2021

(65) Prior Publication Data

US 2023/0027068 A1 Jan. 26, 2023

(51) Int. Cl.
*H04R 7/00* (2006.01)
*B81B 3/00* (2006.01)
*H04R 7/04* (2006.01)

(52) U.S. Cl.
CPC ............... *B81B 3/007* (2013.01); *H04R 7/04* (2013.01); *B81B 2201/0257* (2013.01); *B81B 2203/0127* (2013.01); *B81B 2203/0361* (2013.01); *B81B 2203/04* (2013.01); *B81B 2207/012* (2013.01); *B81B 2207/056* (2013.01); *H04R 2201/003* (2013.01)

(58) Field of Classification Search
CPC ............ B81B 3/007; B81B 2201/0257; B81B 2203/0127; B81B 2203/0361; B81B 2203/04; B81B 2207/012; B81B 2207/056; H04R 7/04; H04R 2201/003
See application file for complete search history.

(56) References Cited

U.S. PATENT DOCUMENTS

| | | | |
|---|---|---|---|
| 4,154,115 A | 5/1979 | Hartung et al. |
| 4,435,986 A | 3/1984 | Choffat |
| 6,075,867 A | 6/2000 | Bay et al. |
| 6,431,003 B1 | 8/2002 | Stark et al. |
| 6,435,033 B2 | 8/2002 | Delaye |
| 6,535,460 B2 | 3/2003 | Loeppert et al. |
| 6,571,445 B2 | 6/2003 | Ladabaum |
| 6,662,663 B2 | 12/2003 | Chen |

(Continued)

FOREIGN PATENT DOCUMENTS

| | | |
|---|---|---|
| CN | 103344377 A | 10/2013 |
| KR | 100571967 B1 | 4/2006 |
| WO | 2012085335 A1 | 6/2012 |

OTHER PUBLICATIONS

Andrews et al., "A comparison of squeeze-film theory with measurements on a microstructure," Sensors and Actuators A 36 (1993) 79-87, 9 pages.

(Continued)

*Primary Examiner* — Matthew A Eason
(74) *Attorney, Agent, or Firm* — Flener IP & Business Law; Zareefa B. Flener

(57) ABSTRACT

A microelectromechanical systems (MEMS) diaphragm assembly comprises a first diaphragm and a second diaphragm. A plurality of pillars connects the first and second diaphragms, wherein the plurality of pillars has a higher distribution density at a geometric center of the MEMS diaphragm assembly than at an outer periphery thereof.

15 Claims, 8 Drawing Sheets

(56) References Cited

U.S. PATENT DOCUMENTS

| | | |
|---|---|---|
| 7,030,407 B2 | 4/2006 | Michler |
| 7,040,173 B2 | 5/2006 | Dehe |
| 7,124,638 B2 | 10/2006 | Kandler |
| 7,150,195 B2 | 12/2006 | Jacobsen et al. |
| 7,190,038 B2 | 3/2007 | Dehe et al. |
| 7,470,546 B2 | 12/2008 | Lehmann |
| 7,489,593 B2 | 2/2009 | Nguyen-Dinh et al. |
| 7,535,156 B2 | 5/2009 | Kvisteroy et al. |
| 7,545,012 B2 | 6/2009 | Smith et al. |
| 7,781,249 B2 | 8/2010 | Laming et al. |
| 7,793,550 B2 | 9/2010 | Elian et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,903,831 B2 | 3/2011 | Song |
| 7,918,135 B2 | 4/2011 | Hammerschmidt |
| 8,127,619 B2 | 3/2012 | Hammerschmidt |
| 8,339,764 B2 | 12/2012 | Steeneken et al. |
| 8,461,655 B2 | 6/2013 | Klein et al. |
| 8,575,037 B2 | 11/2013 | Friza et al. |
| 8,650,963 B2 | 2/2014 | Barr et al. |
| 8,723,277 B2 | 5/2014 | Dehe et al. |
| 8,809,973 B2 | 8/2014 | Theuss |
| 8,969,980 B2 | 3/2015 | Lee |
| 8,989,411 B2 | 3/2015 | Hall et al. |
| 9,031,266 B2 | 5/2015 | Dehe et al. |
| 9,179,221 B2 | 11/2015 | Barzen et al. |
| 9,181,080 B2 | 11/2015 | Dehe et al. |
| 9,237,402 B2 | 1/2016 | Loeppert |
| 9,321,630 B2 | 4/2016 | Xu et al. |
| 9,332,330 B2 | 5/2016 | Elian et al. |
| 9,380,381 B2 | 6/2016 | Straeussnigg et al. |
| 9,383,282 B2 | 7/2016 | Besling et al. |
| 9,383,285 B2 | 7/2016 | Phan Le et al. |
| 9,425,757 B2 | 8/2016 | Straeussnigg et al. |
| 9,432,759 B2 | 8/2016 | Elian et al. |
| 9,438,979 B2 | 9/2016 | Dehe |
| 9,510,107 B2 | 11/2016 | Dehe et al. |
| 9,516,428 B2 | 12/2016 | Dehe et al. |
| 9,549,263 B2 | 1/2017 | Uchida |
| 9,550,211 B2 | 1/2017 | Dirksen et al. |
| 9,631,996 B2 | 4/2017 | Wiesbauer et al. |
| 9,689,770 B2 | 6/2017 | Hammerschmidt |
| 9,828,237 B2 | 11/2017 | Walther et al. |
| 9,884,757 B2 | 2/2018 | Winkler et al. |
| 9,903,779 B2 | 2/2018 | Hammerschmidt |
| 9,942,677 B2 | 4/2018 | Wiesbauer et al. |
| 10,129,676 B2 | 11/2018 | Walther et al. |
| 10,231,061 B2 | 3/2019 | Dehe et al. |
| 10,322,481 B2 | 6/2019 | Dehe et al. |
| 10,433,070 B2 | 10/2019 | Dehe et al. |
| 10,560,771 B2 | 2/2020 | Dehe et al. |
| 10,582,306 B2 | 3/2020 | Dehe |
| 10,589,990 B2 | 3/2020 | Dehe et al. |
| 10,641,626 B2 | 5/2020 | Bretthauer et al. |
| 10,669,151 B2 | 6/2020 | Strasser et al. |
| 10,676,346 B2 | 6/2020 | Walther et al. |
| 10,689,250 B2 | 6/2020 | Fueldner et al. |
| 10,715,926 B2 | 7/2020 | Bretthauer et al. |
| 10,939,214 B2 | 3/2021 | Kuntzman et al. |
| 2005/0177045 A1 | 8/2005 | Degertekin et al. |
| 2005/0207605 A1 | 9/2005 | Dehe et al. |
| 2005/0219953 A1 | 10/2005 | Bayram et al. |
| 2007/0205492 A1 | 9/2007 | Wang |
| 2007/0278501 A1 | 12/2007 | MacPherson et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1 | 5/2010 | Khenkin |
| 2010/0170346 A1 | 7/2010 | Opitz et al. |
| 2010/0173437 A1 | 7/2010 | Wygant et al. |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2013/0001550 A1 | 1/2013 | Seeger et al. |
| 2014/0071642 A1 | 3/2014 | Theuss |
| 2015/0090043 A1 | 4/2015 | Ruhl et al. |
| 2015/0247879 A1 | 9/2015 | Meinhold |
| 2015/0296307 A1 | 10/2015 | Shao et al. |
| 2016/0096726 A1 | 4/2016 | Dehe et al. |
| 2018/0091906 A1 | 3/2018 | Khenkin et al. |
| 2018/0234774 A1 | 8/2018 | Walther et al. |
| 2018/0317022 A1 | 11/2018 | Evans et al. |
| 2019/0112182 A1 | 4/2019 | Metzger-Brueckl et al. |
| 2019/0181776 A1 | 6/2019 | Tumpold et al. |
| 2019/0246459 A1 | 8/2019 | Tumpold et al. |
| 2019/0270639 A1 | 9/2019 | Lorenz et al. |
| 2019/0273993 A1* | 9/2019 | Dehe ............... H04R 19/005 |
| 2019/0331531 A1 | 10/2019 | Glacer et al. |
| 2019/0339193 A1 | 11/2019 | Eberl et al. |
| 2019/0352175 A1 | 11/2019 | Tumpold et al. |
| 2019/0363757 A1 | 11/2019 | Mikolajczak et al. |
| 2020/0057031 A1 | 2/2020 | Theuss et al. |

OTHER PUBLICATIONS

Bay et al., "Design of a silicon microphone with differential read-out of a sealed double parallel-plate capacitor," Sensors and Acutators A 53 (1996), pp. 232-236, 5 pages.

Hansen et al., "Wideband micromachined capacitive microphones with radio frequency detection," J. Acoust. Soc. Am. 116 (2), Aug. 2004, pp. 828-842, 15 pages.

Lin, Der-Song, "Interface Engineering of Capacitive Micromachined Ultrasonic Transducers for Medical Applications," A Dissertation Submitted to the Depailment of Mechanical Engineering and the Committee on Graduate Studies of Stanford University in Partial Fulfillment of the Requirements for the Degree of Doctor of Philosophy, Jun. 2011, 168 pages.

Park et al., "Fabrication of Capacitive Micromachined Ultrasonic Transducers via Local Oxidation and Direct Water Bonding," Journal of Microelectromechanical Systems, vol. 20, No. 1, Feb. 2011, 10 pages.

Krzysztof Iniewski, "Smart Sensors for Industrial Applications," Figure 19. 1, p. 306, 1 page (2013).

Wygant et al., "50 kHz Capacitive Micromachined Ultrasonic Transducers for Generation of Highly Directional Sound with Parametric Arrays," IEEE Transactions on Ultrasonics, Ferroelectrics, and Frequency Control, vol. 56, No. 1, Jan. 2009, pp. 193-203, 11 pages.

* cited by examiner

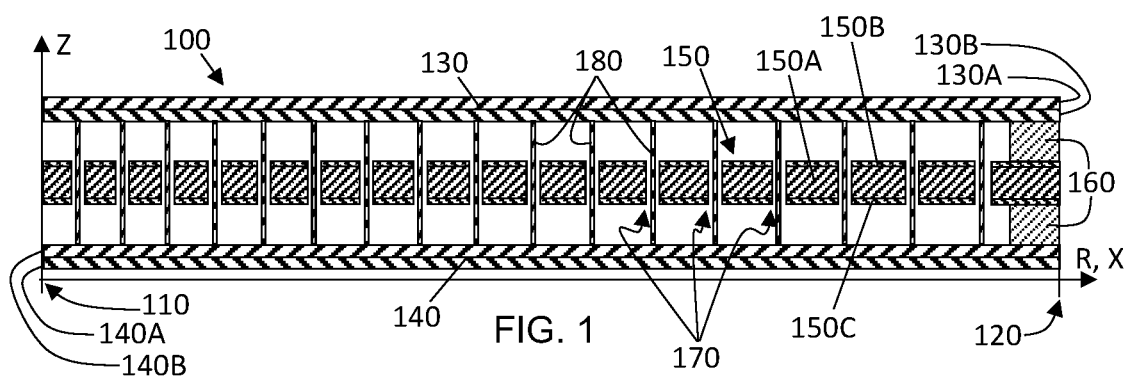
FIG. 1
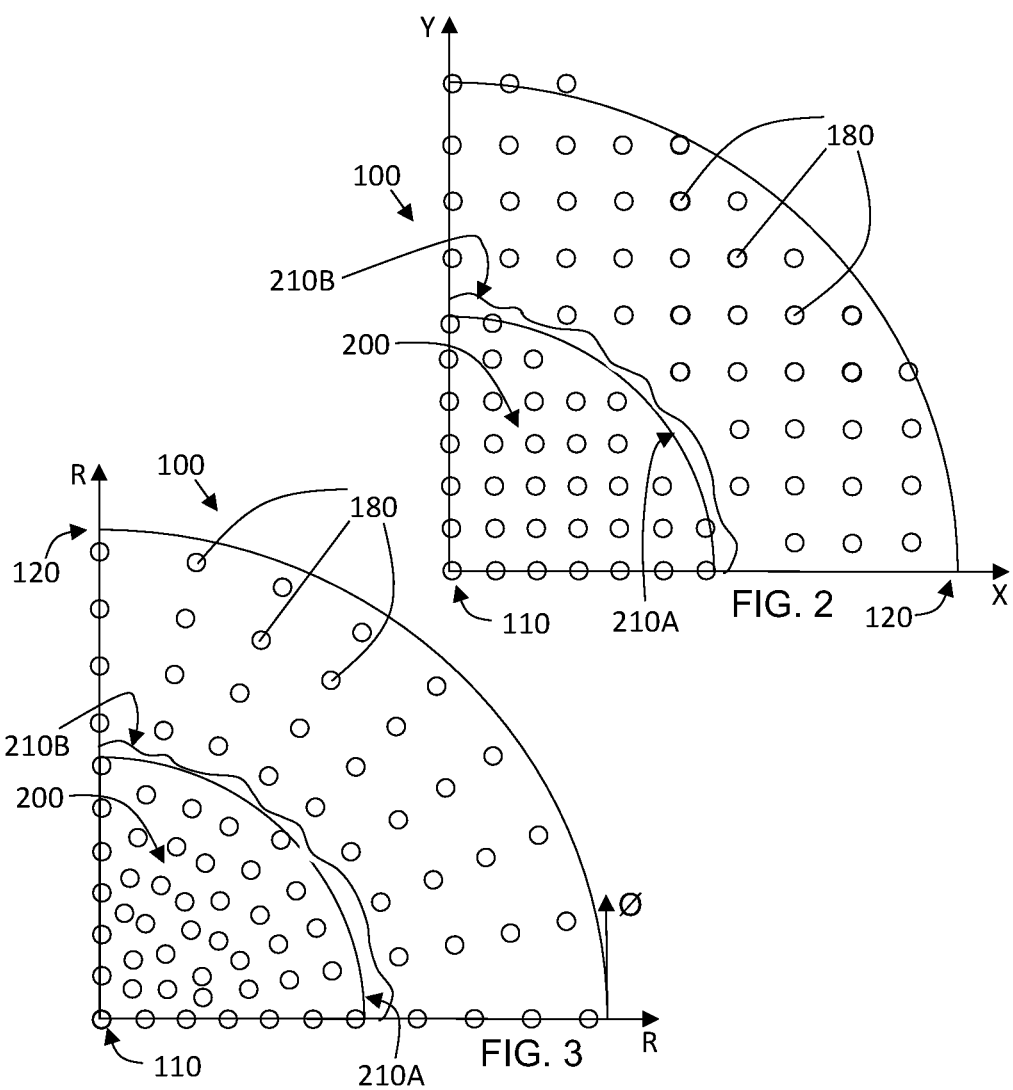
FIG. 2
FIG. 3

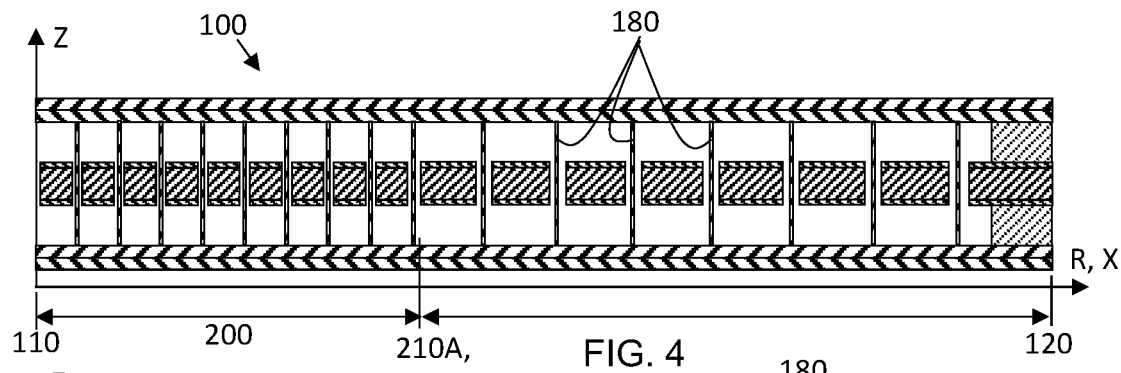
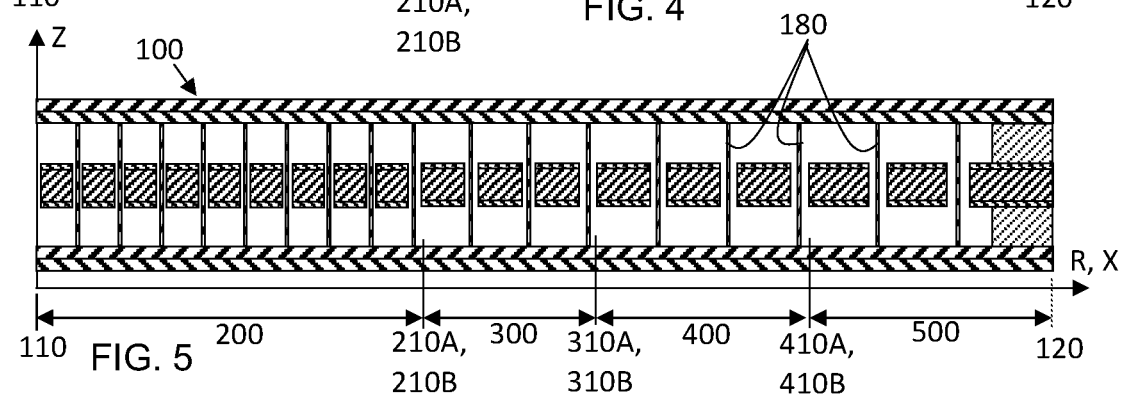
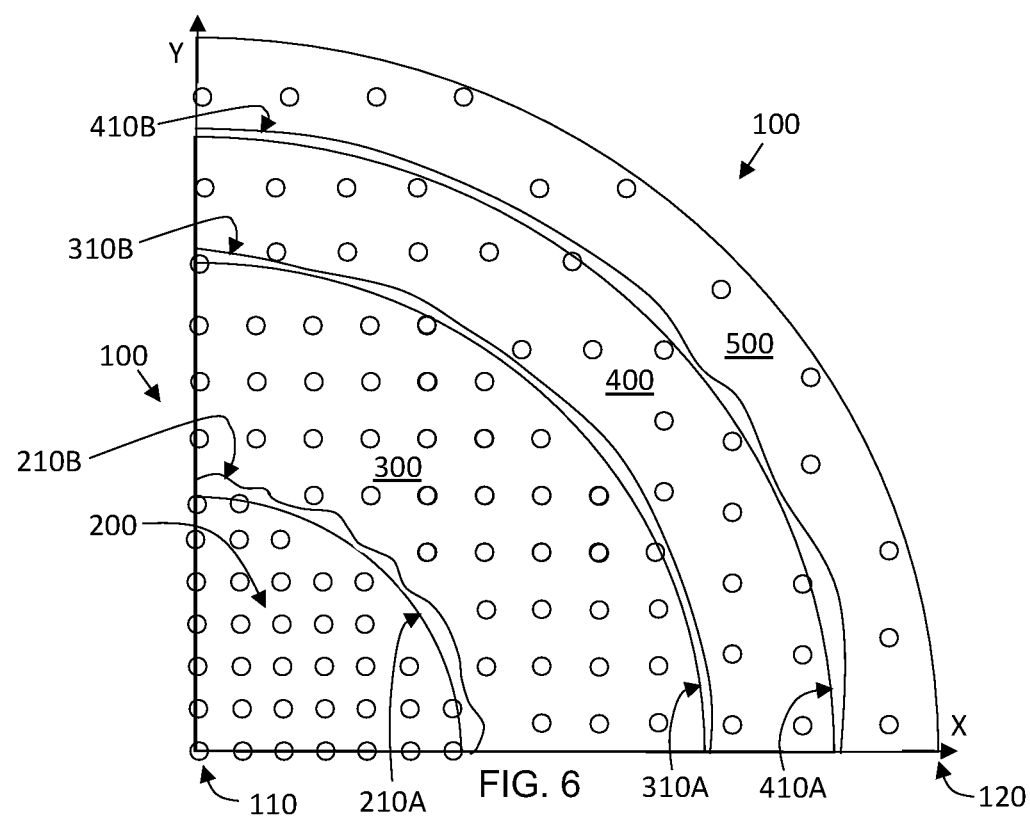

DIAPHRAGM ASSEMBLY WITH NON-UNIFORM PILLAR DISTRIBUTION

FIELD OF THE DISCLOSURE

The present disclosure relates generally to a microelectromechanical systems (MEMS) diaphragm assembly, and more particularly to a MEMS diaphragm assembly having a non-uniform pillar distribution.

BACKGROUND

It is known that in the fabrication of MEMS devices often a plurality of devices are manufactured in a single batch process wherein individual portions of the batch process representative of individual MEMS devices are known as dies. Accordingly, a number of MEMS dies can be manufactured in a single batch process and then cut apart or otherwise separated for further fabrication steps or for their ultimate use, which for example without limitation includes use as an acoustic transducer or other portion of a microphone.

The vibrational response to acoustic stimuli of a dual-diaphragm assembly includes a distribution of velocity over the assembly. Integrating the velocity distribution of the assembly over the entire assembly for a given acoustic stimuli provides a measure of performance known as an acoustic effective area for the assembly. Similarly, integrating the velocity distribution of the assembly over the electrode area of the assembly for a given acoustic stimuli provides a measure of performance known as an electric effective area for the assembly. It has been observed that increasing the acoustic effective area for the assembly decreases the acoustic damping for the assembly, and that increasing the electric effective area for the assembly increases the sensitivity and active capacitance for the assembly, all of which is desirable. A need therefore exists for a dual-diaphragm assembly having a structure that results in increased acoustic and electrical effective areas.

DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope.

FIG. 1 is a cross-sectional schematic view of a MEMS diaphragm assembly, according to an embodiment.

FIG. 2 is a top plan schematic view of a MEMS diaphragm assembly, according to an embodiment.

FIG. 3 is a top plan schematic view of a MEMS diaphragm assembly, according to another embodiment.

FIG. 4 is a cross-sectional schematic view of a MEMS diaphragm assembly, according to a further embodiment.

FIG. 5 is a cross-sectional schematic view of a MEMS diaphragm assembly, according to a still further embodiment.

FIG. 6 is a top plan schematic view of a MEMS diaphragm assembly, according to yet another embodiment.

Figure 7:
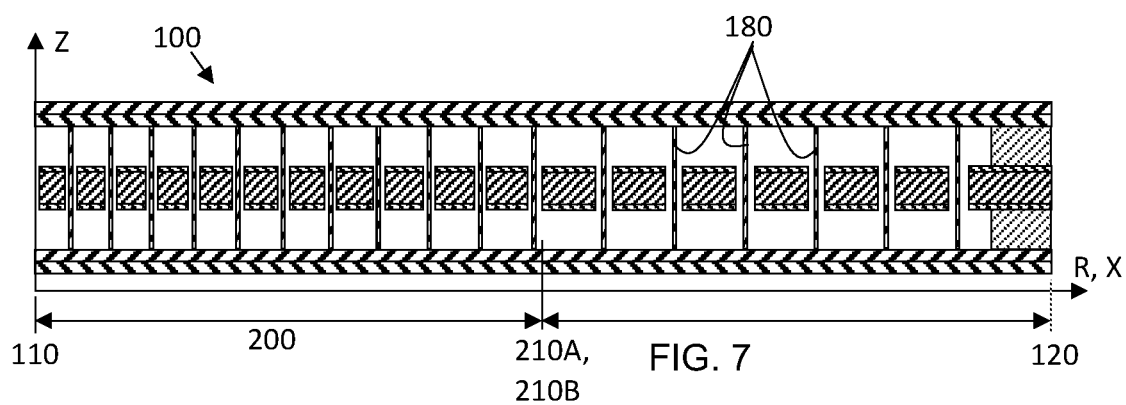
FIG. 7 is a cross-sectional schematic view of a MEMS diaphragm assembly, according to yet another embodiment.

In the following detailed description, various embodiments are described with reference to the appended drawings. The skilled person will understand that the accompanying drawings are schematic and simplified for clarity. Like reference numerals refer to like elements or components throughout. Like elements or components will therefore not necessarily be described in detail with respect to each figure.

DETAILED DESCRIPTION

According to various embodiments described herein, a MEMS diaphragm assembly comprises a first diaphragm and a second diaphragm, wherein a plurality of pillars connect the first and second diaphragms, and wherein the plurality of pillars has a higher distribution density at a geometric center of the MEMS diaphragm assembly than at an outer periphery thereof.

According to other embodiments, the MEMS diaphragm assembly comprises a geometric central region surrounding the geometric center, and an outer region between an outer edge of the geometric central region to the outer periphery of the MEMS diaphragm assembly. In an embodiment, the distribution density of the plurality of pillars is constant within the geometric central region and decreases from the outer edge of the geometric central region to the outer periphery of the MEMS diaphragm assembly. In another embodiment the region between the outer edge of the geometric central region and the outer periphery comprises a plurality of concentric annular regions, and the distribution density of the plurality of pillars is constant within each of the plurality of concentric annular regions.

In an embodiment the distribution density of the plurality of pillars decreases from the geometric center to the outer edge of the geometric central region and remains constant from the outer edge of the geometric central region to the outer periphery of the MEMS diaphragm assembly. In another embodiment the distribution density of the plurality of pillars is constant within the geometric central region, and the distribution density of the plurality of pillars is constant from the outer edge of the geometric central region to the outer periphery of the MEMS diaphragm assembly. In a further embodiment the geometric central region comprises a central core region surrounded by a plurality of concentric annular regions, and the distribution density of the plurality of pillars is constant within each of the central core region and the plurality of concentric annular regions.

In an embodiment the outer edge of the geometric central region is disposed in a range of about 30% to 70% of the distance between the geometric center and the outer periphery of the MEMS diaphragm assembly. In some embodiments the distribution density of the pillars disposed within a region of the MEMS diaphragm assembly is defined by the number of pillars disposed within the region. In other embodiments the distribution density of the pillars disposed within a region of the MEMS diaphragm assembly is defined by the cross-sectional area of the pillars disposed within the region, and in other embodiments the distribution density of the pillars disposed within a region of the MEMS diaphragm assembly is defined by the cross-sectional area of the pillars disposed within the region and by the number of pillars disposed within the region.

Turning to FIG. 1, a MEMS diaphragm assembly generally labeled with the reference numeral 100 according to an embodiment is shown schematically in a cross-sectional view of the assembly taken in the X-Z plane (or R-Z plane as will be explained) showing a portion of the assembly between a geometric center 110 and an outer periphery 120 of the MEMS diaphragm assembly 100. In an embodiment, the MEMS diaphragm assembly 100 includes a first diaphragm 130 and a second diaphragm 140, each of which can comprise more than one layer of material as illustrated. In an embodiment the first diaphragm 130 includes an insulative layer 130A and a conductive layer 130B, and the second diaphragm 140 includes an insulative layer 140A and a conductive layer 140B. The electrically active region of the conductive layer 130B of the first diaphragm 130 may be referred to as a first movable electrode. Similarly, the electrically active region of the conductive layer 140B of the second diaphragm 140 may be referred to as a second movable electrode.

In an embodiment, a stationary electrode assembly 150 is disposed between the first diaphragm 130 and the second diaphragm 140. The first diaphragm 130 and the second diaphragm 140 are connected to the stationary electrode assembly 150 around their outer peripheries 120 by spacer layers 160. In an embodiment the stationary electrode assembly 150 includes an insulative layer 150A, a first conductive layer 150B, and a second conductive layer 150C. The insulative layer 150A is sandwiched between the first conductive layer 150B and the second conductive layer 150C. In one embodiment, the first conductive layer 150B and the second conductive layer 150C are shorted together so as to form a single electrode (also referred to herein as a stationary electrode), which faces the first movable electrode and also faces the second movable electrode. In another embodiment, the first conductive layer 150B and the second conductive layer 150C are electrically isolated from one another, and may be respectively referred to as a first stationary electrode (which faces the first movable electrode) and a second stationary electrode (which faces the second movable electrode). In an embodiment, the stationary electrode assembly 150 is relatively thick and stiff compared to the first and second diaphragms 130 and 140 and remains relatively motionless when the first and second diaphragms 130 and 140 are deflected.

The material of any of the insulative layers 130A, 140A, and 150A can be any insulative material that would not be damaged during a sacrificial layer removal process. For example, without limitation, the insulative material can be silicon nitride, silicon oxynitride, metal oxides, polymers, materials that are not damaged by a sacrificial layer removal process, and combinations thereof. Similarly, the material of any of the conductive layers 130B, 140B, 150B, and 150C can be any conductive material that would not be damaged during a sacrificial layer removal process. For example, without limitation, the conductive material can be polycrystalline silicon, one or more metals, alloys of metals, carbon, materials that are not damaged by a sacrificial layer removal process, and combinations thereof. The structural geometry of materials comprising the first and second diaphragms 130 and 140 and the stationary electrode assembly 150 can be other than those described hereinabove in other embodiments.

Still referring to FIG. 1, in an embodiment the stationary electrode assembly 150 includes a plurality of apertures 170 disposed therethrough (i.e., the apertures are disposed through the stationary electrode or through the first and second stationary electrodes). In an embodiment a plurality of pillars 180 connects the first diaphragm 130 to the second diaphragm 140, wherein each pillar 180 has a first end connected to the first diaphragm 130 and a second end connected to the second diaphragm 140, and wherein each pillar 180 passes through an aperture 170 of the plurality of apertures 170.

FIGS. 2 and 3 illustrate top plan views of exemplary arrangements of the plurality of pillars 180. FIG. 2 illustrates a cartesian (X,Y) grid arrangement and FIG. 3 illustrates a radial/circumferential (R, Ø) grid arrangement. Other arrangements of the plurality of pillars are also possible. Whether the plurality of pillars 180 are arranged based on a cartesian (X,Y) coordinate system as shown in FIG. 2, or a radial/circumferential coordinate system (R, Ø) as shown in FIG. 3, or another pattern of arrangement, it is important to note that the spacing of the plurality of pillars 180 can be the same or different in the X and Y directions (FIG. 2) or in the R and Ø directions (FIG. 3). However, regardless of the actual spacing in any of the directions when viewed in a top plan view, the plurality of pillars 180 has a higher distribution density at the geometric center 110 of the MEMS diaphragm assembly 100 than at the outer periphery 120 thereof.

Referring again to FIG. 1, for example, in this embodiment of the MEMS diaphragm assembly 100, the plurality of pillars 180 all have the same cross-sectional area, but are shown to be spaced further apart in the R, X direction going from the geometric center 110 on the left toward the outer periphery 120 on the right. FIG. 1 represents an embodiment wherein the plurality of pillars 180 has a higher distribution density at the geometric center 110 of the MEMS diaphragm assembly 100 than at the outer periphery 120 thereof, and wherein the distribution density of the plurality of pillars 180 decreases in a generally continuous pattern between the geometric center 110 and the outer periphery 120.

As will be fully described in regard to FIGS. 2-12, the distribution density of the plurality of pillars 180 can be increased or decreased by changing one or more of any of several structural features. For example, defining the distribution density of the plurality of pillars 180 in a region of the MEMS diaphragm assembly 100 as the cross-sectional area when viewed from a top view of the plurality of pillars 180 per unit area of the region of the MEMS diaphragm assembly 100. Therefore, the distribution density can be increased by positioning the plurality of pillars 180 closer together. The distribution density can also be increased by increasing the cross-sectional areas of some or all of the plurality of pillars 180.

Referring now to FIGS. 2-4, the MEMS diaphragm assembly 100 is illustrated has having a geometric central region 200 surrounding the geometric center 110. The geometric central region 200 is bounded at an outer edge that may be of constant radius as shown by the arc 210A or that may vary across a range of radii as shown by the line 210B. Regardless of its actual shape, the outer edge 210A, 210B separates the MEMS diaphragm assembly 100 into the geometric central region 200 and the region between the outer edge 210A, 210B and the outer periphery 120.

Referring in particular to FIG. 4, in an embodiment of the MEMS diaphragm assembly 100, the plurality of pillars 180 again all having the same cross-sectional area are shown to have a first constant spacing in the R, X direction in the geometric central region 200, but are shown to be spaced further and further apart in the R, X direction going from the outer edge 210A, 210B toward the outer periphery 120 on the right. FIG. 4 therefore represents an embodiment wherein the plurality of pillars 180 has a higher distribution density at the geometric center 110 of the MEMS diaphragm assembly 100 than at the outer periphery 120 thereof, wherein the distribution density of the plurality of pillars 180 is constant within the geometric central region 200 and decreases from the outer edge 210A, 210B of the geometric central region 200 to the outer periphery of the MEMS diaphragm assembly 100.

Referring to FIGS. 5 and 6, in an embodiment of the MEMS diaphragm assembly 100, the plurality of pillars 180 again all having the same cross-sectional area are shown to have a first constant spacing in the R, X direction in the geometric central region 200. In this embodiment the region between the outer edge 210A, 210B of the geometric central region 200 and the outer periphery 120 comprises a plurality of generally concentric annular regions, for example, the regions 300, 400, 500 as illustrated. The outermost generally concentric annular regions 500 in this example is bounded by the outer periphery 120 of the MEMS diaphragm assembly 100. The other generally concentric annular regions 300 and 400 in this example that are disposed between the geometric central region 200 and the outermost annular region 500 are separated by boundaries that may be of constant radius as shown by the arcs 310A and 410A or that may vary across a range of radii as shown by the lines 310B and 410B.

Regardless of their actual shape, the boundaries 310A, 310B and 410A, 410B separate the region between the outer edge 210A, 210B of the geometric central region 200 and the outer periphery 120 into the plurality of generally concentric annular regions 300, 400, 500 in this embodiment. The distribution density of the plurality of pillars 180 is constant within each of the plurality of concentric annular regions 300, 400, 500. FIGS. 5 and 6 therefore represent an embodiment wherein the plurality of pillars 180 has a higher distribution density at the geometric center 110 of the MEMS diaphragm assembly 100 than at the outer periphery 120 thereof, wherein the distribution density of the plurality of pillars 180 is constant within the geometric central region 200, wherein the region between the outer edge 210A, 210B of the geometric central region 200 and the outer periphery 120 comprises a plurality of concentric annular regions 300, 400, 500 in this embodiment, and wherein the distribution density of the plurality of pillars 180 is constant within each of the plurality of concentric annular regions 300, 400, 500. Three concentric annular regions 300, 400, 500 are illustrated; however, in other embodiments there can be four, five, six, or more concentric annular regions wherein the distribution density of the plurality of pillars 180 is constant within each region.

Referring to FIG. 7, in an embodiment of the MEMS diaphragm assembly 100, the plurality of pillars 180 again all having the same cross-sectional area are shown to have an increasing spacing in the R, X direction in the geometric central region 200 from the geometric center 110 toward the outer edge 210A, 210B, but are shown to be constantly spaced apart in the R, X direction going from the outer edge 210A, 210B toward the outer periphery 120 on the right. FIG. 7 therefore represents an embodiment wherein the plurality of pillars 180 has a higher distribution density at the geometric center 110 of the MEMS diaphragm assembly 100 than at the outer periphery 120 thereof, wherein the geometric central region 200 surrounds the geometric center 110, and wherein the distribution density of the plurality of pillars 180 decreases from the geometric center 110 to the outer edge 210A, 210B of the geometric central region 200 and remains constant from the outer edge 210A, 210B of the geometric central region 200 to the outer periphery 120 of the MEMS diaphragm assembly 100.

Figure 8:
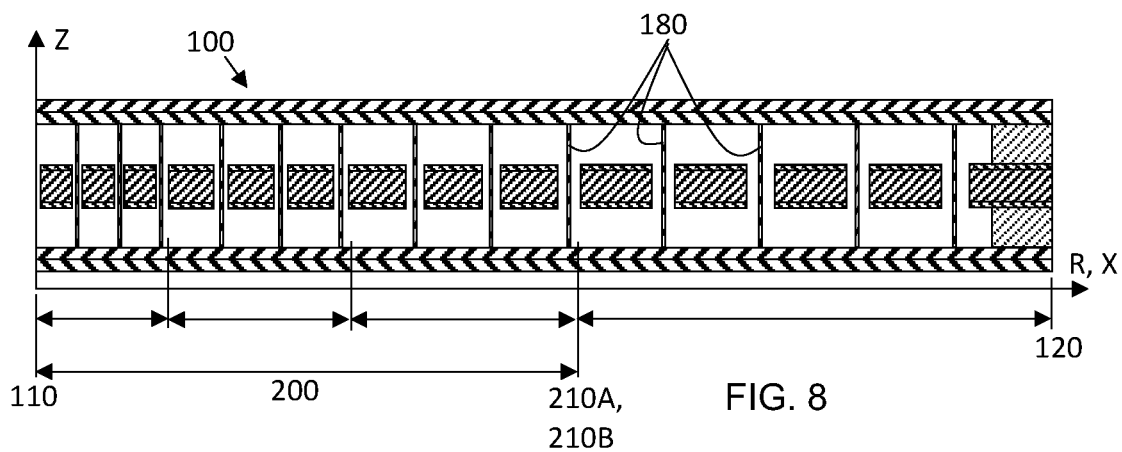
FIG. 8 is a cross-sectional schematic view of a MEMS diaphragm assembly, according to yet a further embodiment.
Figure 9:
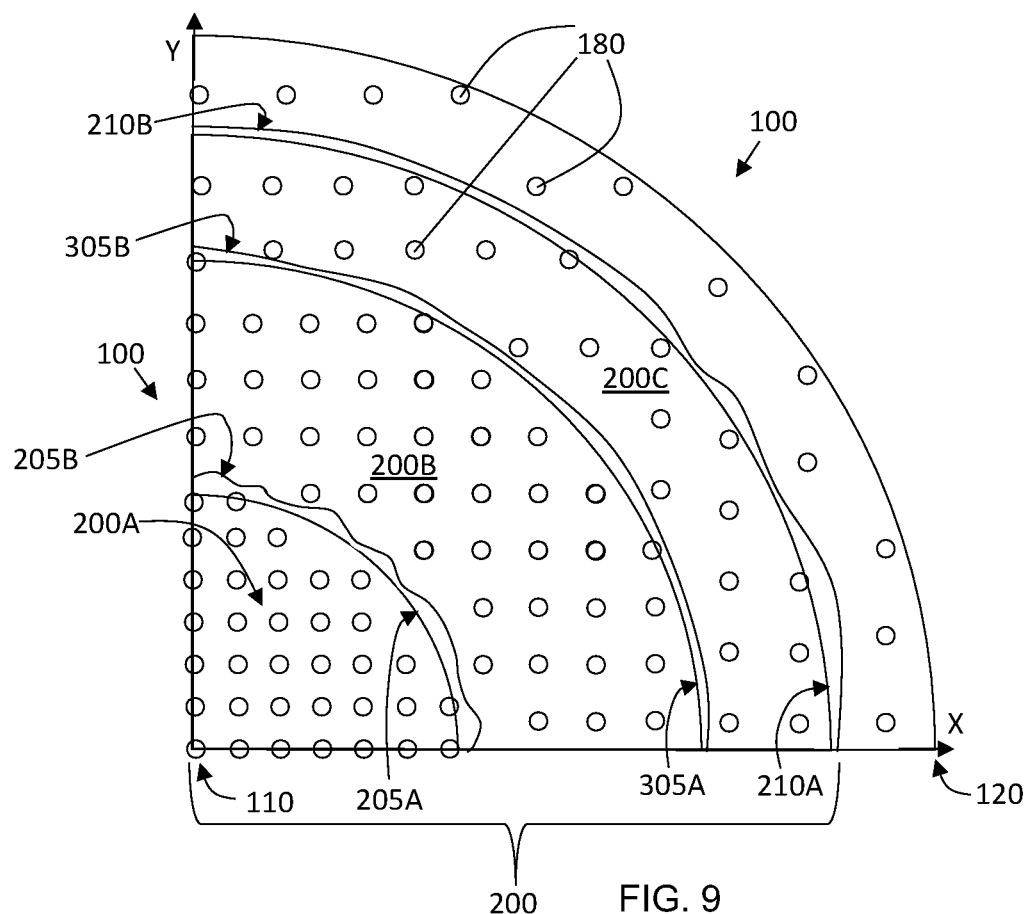
FIG. 9 is a top plan schematic view of a MEMS diaphragm assembly, according to a still further another embodiment.

Referring to FIGS. 8 and 9, in an embodiment of the MEMS diaphragm assembly 100 similar to the embodiment described hereinabove regarding FIGS. 5 and 6, the plurality of pillars 180 again all having the same cross-sectional area are shown to have a spacing in the geometric central region 200 that increases in the R, X direction from the geometric center 110 to the outer edge 210A, 210B of the geometric central region 200. In this embodiment the geometric central region 200 comprises a central core region 200A surrounded by a plurality of generally concentric annular regions, for example, regions 200B and 200C as illustrated in FIG. 9. The generally concentric annular regions 200B and 200C in this example are separated from the central core region 200A and from each other by boundaries that may be of constant radius as shown by the arcs 205A and 305A, respectively, or that may vary across a range of radii as shown by the lines 205B and 305B, respectively.

Regardless of their actual shape, the boundaries 205A, 205B and 305A, 305B separate the geometric central region 200 into the central core region 200A and the plurality of generally concentric annular regions, 200B and 200C in this embodiment. The distribution density of the plurality of pillars 180 is constant within the central core region 200A and within each of the plurality of generally concentric annular regions, 200B and 200C. FIGS. 8 and 9 therefore represent an embodiment wherein the plurality of pillars 180 has a higher distribution density at the geometric center 110 of the MEMS diaphragm assembly 100 than at the outer periphery 120 thereof, wherein the geometric central region 200 comprises a central core region 200A surrounded by a plurality of generally concentric annular regions 200B and 200C, and wherein the distribution density of the plurality of pillars 180 is constant within each of the central core region 200A and the plurality of generally concentric annular regions 200B and 200C. Two generally concentric annular regions 200B and 200C are illustrated; however, in other embodiments there can be four, five, six, or more generally concentric annular regions within the geometric central region 200 wherein the distribution density of the plurality of pillars 180 is constant within each generally concentric annular region.

Figure 10:
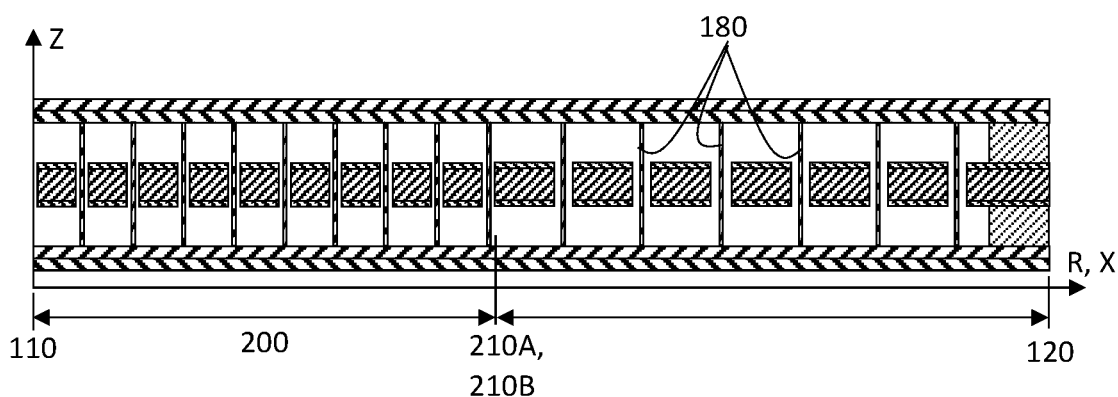
FIG. 10 is a cross-sectional schematic view of a MEMS diaphragm assembly, according to yet another embodiment.

Referring to FIGS. 2, 3, and 10, in an embodiment the MEMS diaphragm assembly 100 is illustrated as having the geometric central region 200 surrounding the geometric center 110. The geometric central region 200 is bounded at an outer edge that may be of constant radius as shown by the arc 210A or that may vary across a range of radii as shown by the line 210B. Regardless of its actual shape, the outer edge 210A, 210B separates the MEMS diaphragm assembly 100 into the geometric central region 200 and the region between the outer edge 210A, 210B and the outer periphery 120. Referring now to FIG. 10, in this embodiment of the MEMS diaphragm assembly 100, the plurality of pillars 180 again all having the same cross-sectional area are shown to have a first constant spacing in the R, X direction in the geometric central region 200, and have a second constant spacing in the R, X direction going from the outer edge 210A, 210B toward the outer periphery 120 on the right. FIG. 10 therefore represents an embodiment wherein the plurality of pillars 180 has a higher distribution density at the geometric center 110 of the MEMS diaphragm assembly 100 than at the outer periphery 120 thereof, wherein the distribution density of the plurality of pillars 180 is constant within the geometric central region 200, and wherein the distribution density of the plurality of pillars 180 is constant from the outer edge 210A, 210B of the geometric central region 200 to the outer periphery 120 of the MEMS diaphragm assembly 100.

Referring to any of FIGS. 2-10, in an embodiment the outer edge 210A, 210B of the geometric central region 200 is disposed in a range of about 30% to 70% of the distance between the geometric center 110 and the outer periphery 120 of the MEMS diaphragm assembly 100. In another embodiment the outer edge 210A, 210B of the geometric central region 200 is disposed in a range of about 40% to 60% of the distance between the geometric center 110 and the outer periphery 120 of the MEMS diaphragm assembly 100. In a further embodiment the outer edge 210A, 210B of the geometric central region 200 is disposed at about 50% of the distance between the geometric center 110 and the outer periphery 120 of the MEMS diaphragm assembly 100.

Figure 11:
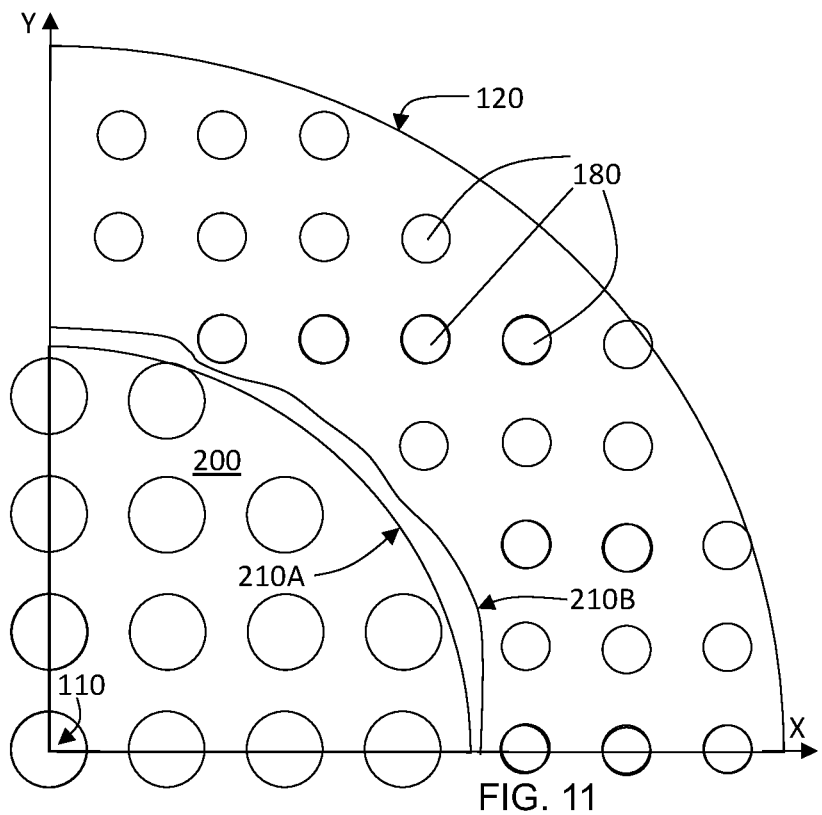
FIG. 11 is a top plan schematic view of a MEMS diaphragm assembly, illustrating pillars of different sizes, according to an embodiment.
Figure 12:
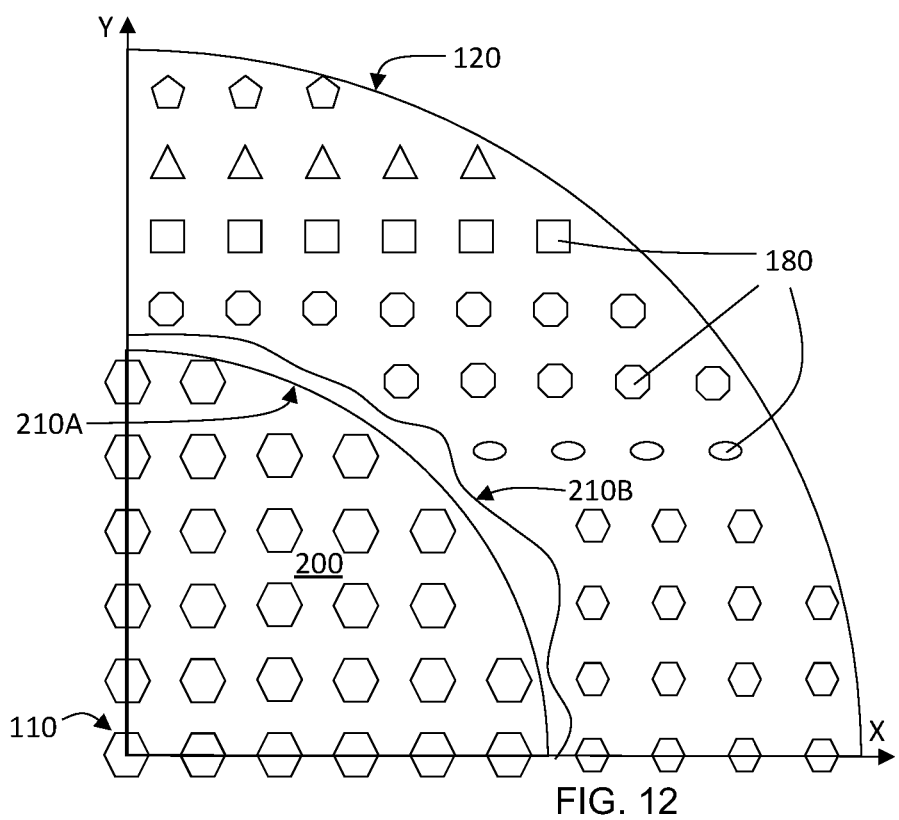
FIG. 12 is a top plan schematic view of a MEMS diaphragm assembly, illustrating pillars of different shaped, according to an embodiment.

As noted hereinabove, the distribution density of the plurality of pillars 180 can be increased or decreased by spacing the plurality of pillars 180 closer together or further apart relative to one another, respectively. The distribution density can also be increased by increasing the cross-sectional areas of some or all of the plurality of pillars 180. For example, FIG. 11 illustrates a top view of an exemplary MEMS diaphragm assembly 100 having the same general structure as that shown in FIG. 2 above except that in FIG. 11 the plurality of pillars 180 has more than one cross-sectional area. FIG. 11, like FIG. 2 represents an embodiment wherein the plurality of pillars 180 has a higher distribution density at the geometric center 110 of the MEMS diaphragm assembly 100 than at the outer periphery 120 thereof, wherein the distribution density of the plurality of pillars 180 is constant within the geometric central region 200, and wherein the distribution density of the plurality of pillars 180 is constant from the outer edge 210A, 210B of the geometric central region 200 to the outer periphery 120 of the MEMS diaphragm assembly 100. However, unlike the MEMS diaphragm assembly 100 shown in FIG. 2 wherein the plurality of pillars 180 all have the same cross-sectional area, in the embodiment shown by FIG. 11, the pillars 180 within the geometric central region 200 have a larger cross-sectional area than do the pillars 180 disposed between the outer edge 210A, 210B of the geometric central region 200 and the outer periphery 120 of the MEMS diaphragm assembly 100.

FIG. 11 illustrates all of the pillars 180 within the geometric central region 200 as having the same cross-sectional area. However, the cross-sectional area of individual pillars 180 may vary and need not be the same. Similarly, the pillars 180 between the outer edge 210A, 210B of the geometric central region 200 and the outer periphery 120 are shown as also having the same cross-sectional area, but again, the cross-sectional area of individual pillars 180 disposed between the outer edge 210A, 210B of the geometric central region 200 and the outer periphery 120 may also vary and need not be the same. Any of the embodiments described in detail hereinabove having the distribution density of the plurality of pillars 180 determined by the pillar spacing or the number of pillars 180 per unit area within a region may instead of or in addition to the spacing/number of pillars per unit area have the distribution density of the plurality of pillars 180 determined by the cross-sectional area of the plurality of pillars 180.

In addition to variations in the size and spacing of the plurality of pillars 180, the plurality of pillars 180 need not be circular and may be of any cross-sectional shape. For example, without limitation, referring to FIG. 12, exemplary pillars 180 are shown having triangular, elliptical, square, pentagonal, hexagonal, and octagonal cross-sections. The pillars 180 can in fact have a cross-sectional shape of any regular or irregular polygon and the shapes can be the same or vary within any single region of the MEMS diaphragm assembly 100 as defined hereinabove, or the shapes can be the same or vary across the regions of the MEMS diaphragm assembly 100 as defined hereinabove.

Figure 13:
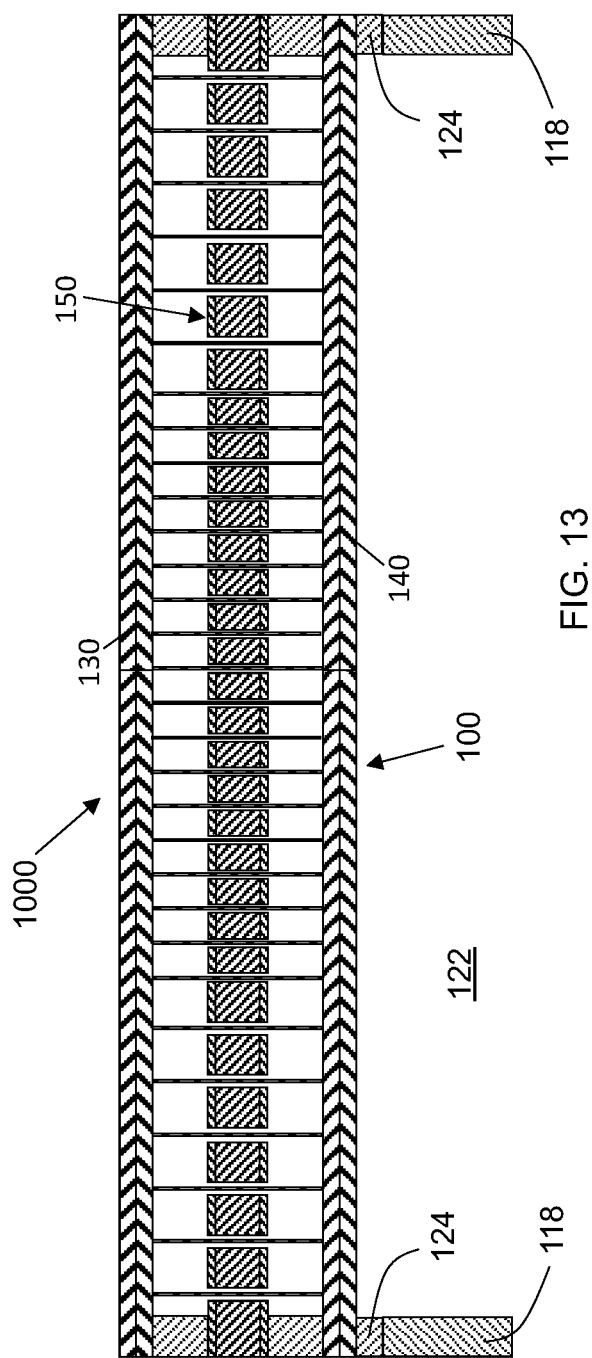
FIG. 13 is a cross-sectional schematic view of an exemplary MEMS die utilizing an embodiment of the MEMS diaphragm assembly.

Referring to FIG. 13, in an embodiment a MEMS die 1000, for example, used as an acoustic transducer 1000 includes the MEMS diaphragm assembly 100 attached to a substrate 118, shown in cross-section in FIG. 13. In an embodiment the substrate 118 has a generally rectangular perimeter when viewed from above in FIG. 13, but in other embodiments it can be any shape. The substrate 118 in an embodiment includes an opening 122 formed therethrough.

In an embodiment the second diaphragm 140 is attached around the outer periphery 120 thereof to the substrate 118 over the opening 122 via a spacer layer 124. In other embodiments at least a portion of the second diaphragm 140 is attached directly to the substrate 118. In some embodiments the spacer layer 124 can be an integral part of the substrate 118 or added onto the substrate 118 as an additional sacrificial layer 124. The spacer layer 124 can, for example, be made of any insulative material as described hereinabove. In an embodiment the substrate 118 is made of silicon.

Figure 14:
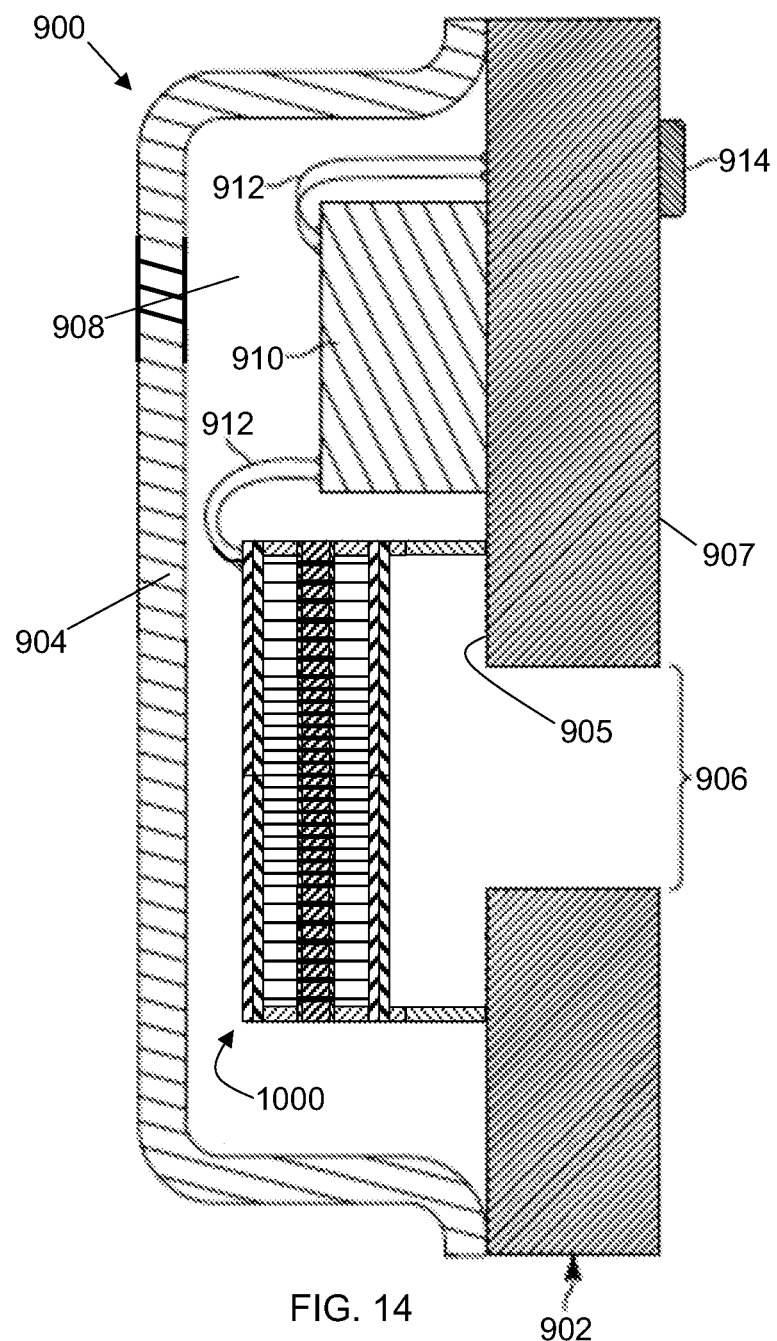
FIG. 14 is a cross-sectional schematic view of an exemplary microphone device utilizing the exemplary MEMS die of FIG. 13.
Figure 15:
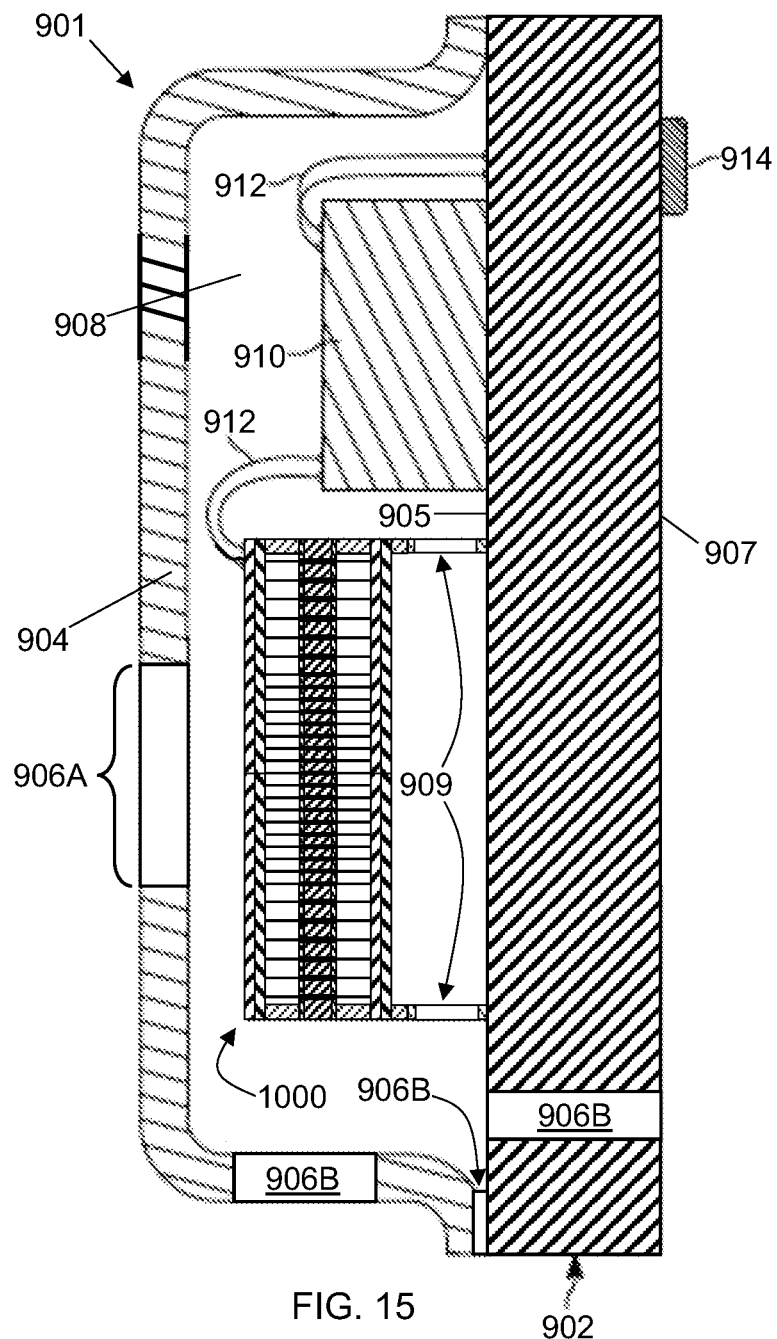
FIG. 15 is a cross-sectional schematic view of another exemplary microphone device utilizing the exemplary MEMS die of FIG. 13.

FIGS. 14 and 15 illustrate some exemplary embodiments of a microphone device 900, 901, respectively, that utilize the MEMS die 1000. The exemplary microphone devices 900, 901 both comprise a housing having a sound port, wherein the MEMS die 1000 is disposed within the housing, and wherein the sound port is acoustically coupled to the MEMS die 1000.

Referring to FIG. 14, the MEMS die 1000 used, for example, as an acoustic transducer 1000 is configured to fit within the exemplary microphone device 900. The microphone device 900 includes a housing including a base 902 having a first surface 905 and an opposing second surface 907. The housing further includes a cover 904 (e.g., a housing lid), and an acoustic port 906. In an embodiment the port 906 extends between the first surface 905 and the second surface 907. In one implementation, the base 902 is a printed circuit board. The cover 904 is coupled to the base 902 (e.g., the cover 904 may be mounted onto a peripheral edge of the base 902). Together, the cover 904 and the base 902 form an enclosed volume 908 for the microphone device 900.

As shown in FIG. 14, in an embodiment of the microphone device 900, which is representative of an exemplary bottom-port microphone device, an acoustic port 906 is disposed on the base 902 and is structured to convey sound waves to the MEMS die 1000 located within the enclosed volume 908. The microphone device 900 includes an electrical circuit disposed within the enclosed volume 908. In an embodiment, the electrical circuit includes an integrated circuit (IC) 910. In an embodiment the IC 910 is disposed on the first surface 905 of the base 902. The IC 910 may be an application specific integrated circuit (ASIC). Alternatively, the IC 910 may include a semiconductor die integrating various analog, analog-to-digital, and/or digital circuits. In an embodiment the cover 904 is disposed over the first surface 905 of the base 902 covering the MEMS die 1000 and the IC 910.

As shown in FIG. 15, in an embodiment of the microphone device 901, which is representative of an exemplary top-port microphone device, an acoustic port 906A is disposed on the cover 904 and/or a side wall of the cover 904, and is again structured to convey sound waves to the MEMS die 1000 located within the enclosed volume 908 In the microphone device 901 of FIG. 15, the MEMS die 1000 is illustrated as being disposed on the first surface 905 of the base 902. In other embodiments of the microphone device 901, the MEMS die 1000 can be disposed on other surfaces within the housing, which includes any internal surfaces of the base 902 or the cover 904.

In a further embodiment the MEMS die 1000 is disposed on the first surface 905 of the base 902 as illustrated but further includes openings or cutouts 909 disposed through the substrate portion 118 (see FIG. 13). The cutouts 909 allow the portion of the enclosed volume 908 disposed behind the MEMS die 1000 relative to the port 906A to equilibrate in pressure with the rest of the enclosed volume 908. In other embodiments, one or more vent openings 906B can be disposed, for example, through the cover 904, through the base 902, and/or forming a gap between the cover 904 and the base 902.

In some embodiments, the microphone device 900, 901 forms part of a compact computing device (e.g., a portable communication device, a smartphone, a smart speaker, an internet of things (IoT) device, etc.), where one, two, three or more microphone devices 900, 901 may be integrated for picking-up and processing various types of acoustic signals such as speech and music. The MEMS die 1000, used as an acoustic transducer 1000, converts sound waves, received through acoustic port 906, 906A, into a corresponding electrical microphone signal, and generates an electrical signal (e.g., a voltage) at a transducer output in response to acoustic activity incident on the port 906, 906A.

As shown in FIGS. 14 and 15, the transducer output includes a pad or terminal of the acoustic transducer 1000 that is electrically connected to the electrical circuit via one or more bonding wires 912. The microphone device 900, 901 further includes electrical contacts, shown schematically as contacts 914, typically disposed on a bottom surface of the base 902. The contacts 914 are electrically coupled to the electrical circuit. The contacts 914 are configured to electrically connect the microphone device 900, 901 to one of a variety of host devices.

During operation of the MEMS diaphragm assembly 100 described hereinabove, for example as part of the acoustic transducer 1000 shown in FIGS. 13 and 14, electric charge is applied to the conductive layers 150B and 150C of the stationary electrode assembly 150 and the first and second movable electrodes defined hereinabove as the electrically active regions of the conductive layers 130B, 140B of the first and second diaphragms 130, 140, respectively, thereby inducing an electric field between the stationary electrode(s) of the stationary electrode assembly 150 and the first and second movable electrodes. Movement of the air (e.g., resulting from sound waves) pushes against the outer surface of the MEMS diaphragm assembly 100 facing the opening 122 causing the first and second diaphragms 130, 140 to deflect (enter a deflection state) and to deform. This deformation causes a change in the capacitance between the one or more stationary electrodes of the stationary electrode assembly 150 and the first and second diaphragms 130, 140, which can be detected and interpreted as sound.

As noted hereinabove, a plurality of MEMS devices can be manufactured in a single batch process. Individual portions of the batch process representative of individual MEMS devices are known as dies. Accordingly, a number of MEMS dies can be manufactured in a single batch process and then cut apart or otherwise separated for further fabrication steps or for their ultimate use, which for example without limitation includes as an acoustic transducer or other portion of a microphone.

Steps in a production process utilized to produce the MEMS diaphragm assembly 100 as described hereinabove include etching, masking, patterning, cutting, boring, and/or release steps executed on a workpiece. All of the steps are not described in detail herein. However, generally the portions of the MEMS diaphragm assembly 100 (and the larger MEMS die 1000 of which it can be a part) that ultimately end up as the structures of the first and second diaphragms 130, 140, the stationary electrode assembly 150, and the plurality of pillars 180 are applied onto a workpiece in particular layers or patterns and the spaces between the structures are created utilizing sacrificial material, or are otherwise bored or etched out of a solid block of material.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

Unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical systems (MEMS) diaphragm assembly comprising:
    a first diaphragm;
    a second diaphragm; and
    a plurality of pillars connecting the first and second diaphragms, wherein the plurality of pillars has a higher distribution density at a geometric center of the MEMS diaphragm assembly than at an outer periphery thereof;
    wherein a geometric central region surrounds the geometric center, and wherein the distribution density of the plurality of pillars is constant within the geometric central region and decreases from an outer edge of the geometric central region to the outer periphery.

2. The MEMS diaphragm assembly of claim 1, wherein the region between the outer edge of the geometric central region and the outer periphery comprises a plurality of concentric annular regions, and wherein the distribution density of the plurality of pillars is constant within each of the plurality of concentric annular regions.

3. The MEMS diaphragm assembly of claim 1, wherein the outer edge of the geometric central region is disposed in a range of about 30% to 70% of the distance between the geometric center and the outer periphery of the MEMS diaphragm assembly.

4. The MEMS diaphragm assembly of claim 3, wherein the outer edge of the geometric central region is disposed in a range of about 40% to 60% of the distance between the geometric center and the outer periphery of the MEMS diaphragm assembly.

5. The MEMS diaphragm assembly of claim 4, wherein the outer edge of the geometric central region is disposed at about 50% of the distance between the geometric center and the outer periphery of the MEMS diaphragm assembly.

6. The MEMS diaphragm assembly of claim 1, wherein the distribution density of the pillars disposed within a region of the MEMS diaphragm assembly is defined by the number of pillars disposed within the region.

7. The MEMS diaphragm assembly of claim 1, wherein the distribution density of the pillars disposed within a region of the MEMS diaphragm assembly is defined by the cross-sectional area of the pillars disposed within the region.

8. The MEMS diaphragm assembly of claim 1, wherein the distribution density of the pillars disposed within a region of the MEMS diaphragm assembly is defined by the cross-sectional area of the pillars disposed within the region and by the number of pillars disposed within the region.

9. A microelectromechanical systems (MEMS) die, comprising:
a diaphragm assembly, comprising:
a first diaphragm;
a second diaphragm;
a plurality of pillars connecting the first and second diaphragms, wherein the plurality of pillars has a higher distribution density at a geometric center of the diaphragm assembly than at an outer periphery thereof;
wherein a geometric central region surrounds the geometric center, and wherein the distribution density of the plurality of pillars is constant within the geometric central region and decreases from an outer edge of the geometric central region to the outer periphery; and
a substrate having an opening formed therethrough;
wherein the diaphragm assembly is attached around the outer periphery thereof to the substrate and over the opening.

10. A microphone device, comprising:
a housing having a sound port; and
the MEMS die of claim 9 disposed within the housing;
wherein the sound port is acoustically coupled to the MEMS die.

11. A microelectromechanical systems (MEMS) diaphragm assembly comprising:
a first diaphragm;
a second diaphragm;
a stationary electrode assembly disposed between the first and second diaphragms, the stationary electrode assembly comprising a first plurality of apertures disposed therethrough and proximate to a geometric center of the MEMS diaphragm assembly and a second plurality of apertures disposed therethrough and proximate to an outer periphery of the MEMS diaphragm assembly, wherein the apertures of the first plurality are spaced closer together radially than the apertures of the second plurality; and
a plurality of pillars connecting the first and second diaphragms, wherein each pillar passes through an aperture of the first plurality of apertures.

12. The MEMS diaphragm assembly of claim 11, wherein a pillar of the plurality of pillars passes through each of the first plurality of apertures.

13. The MEMS diaphragm assembly of claim 12, wherein the apertures of the first plurality have a smaller radial dimension than the apertures of the second plurality.

14. A microelectromechanical systems (MEMS) die, comprising:
the diaphragm assembly of claim 11; and
a substrate having an opening formed therethrough;
wherein the diaphragm assembly is attached around the outer periphery thereof to the substrate and over the opening.

15. A microphone device, comprising:
a housing having a sound port; and
the MEMS die of claim 14 disposed within the housing;
wherein the sound port is acoustically coupled to the MEMS die.

* * * * *